(12) United States Patent
Sunshine et al.

(10) Patent No.: US 10,732,728 B1
(45) Date of Patent: Aug. 4, 2020

(54) KEYBOARD WITH TOUCH SENSOR

(71) Applicant: Apple Inc., Cupertino, CA (US)

(72) Inventors: Daniel D. Sunshine, Sunnyvale, CA (US); Daniel A. Podhajny, San Jose, CA (US); David M. Kindlon, Lake Arrowhead, CA (US)

(73) Assignee: Apple Inc., Cupertino, CA (US)

( * ) Notice: Subject to any disclaimer, the term of this patent is extended or adjusted under 35 U.S.C. 154(b) by 11 days.

(21) Appl. No.: 15/467,986

(22) Filed: Mar. 23, 2017

Related U.S. Application Data

(60) Provisional application No. 62/331,892, filed on May 4, 2016.

(51) Int. Cl.
*G06F 3/02* (2006.01)
*G06F 3/041* (2006.01)
*G06F 3/044* (2006.01)

(52) U.S. Cl.
CPC ............ *G06F 3/0213* (2013.01); *G06F 3/044* (2013.01); *G06F 3/0416* (2013.01); *G06F 2203/04104* (2013.01); *G06F 2203/04111* (2013.01)

(58) Field of Classification Search
CPC ...... G06F 3/02; G06F 3/0205; G06F 3/04886; G06F 3/0488; G06F 3/04883; G06F 3/0487
See application file for complete search history.

(56) References Cited

U.S. PATENT DOCUMENTS

| | | | |
|---|---|---|---|
| 6,947,031 B2 | 9/2005 | Sandbach et al. | |
| 7,161,084 B2* | 1/2007 | Sandbach | G06F 3/023 174/117 M |
| 7,230,610 B2 | 6/2007 | Jung et al. | |
| 8,441,450 B2 | 5/2013 | Degner et al. | |
| 9,092,068 B1* | 7/2015 | Hamburgen | G06F 3/0489 |
| 9,612,644 B2* | 4/2017 | Tokioka | H03K 17/223 |
| 9,983,747 B2* | 5/2018 | Poupyrev | D03D 1/0088 |
| 2002/0135457 A1* | 9/2002 | Sandbach | G06F 3/023 338/47 |
| 2002/0162457 A1* | 11/2002 | Hyodo | F02M 25/089 96/109 |
| 2005/0095934 A1* | 5/2005 | Serban | G06F 3/0221 442/110 |
| 2007/0176902 A1* | 8/2007 | Newman | G06F 1/1626 345/168 |

(Continued)

OTHER PUBLICATIONS

Takamatsu, Seiichi et al., Flexible Fabric Keyboard with Conductive Polymer-Coated Fibers, In Proceedings of Sensors 2011,(Oct. 28, 2011).*

*Primary Examiner* — Kenneth Bukowski
(74) *Attorney, Agent, or Firm* — Treyz Law Group, P.C.; G. Victor Treyz; Matthew R. Williams

(57) ABSTRACT

A keyboard may be provided that has keys overlapped by a touch sensor. The keyboard may have key sensor circuitry for monitoring switching in the keys for key press input. The keyboard may also have touch sensor circuitry such as capacitive touch sensor circuitry that monitors capacitive electrodes in the touch sensor for touch sensor input such as multitouch gesture input. The touch sensor may be formed from a layer of fabric. The fabric may be woven fabric or other fabric in which conductive strands of material serve as the electrodes for the touch sensor.

20 Claims, 10 Drawing Sheets

(56) References Cited

U.S. PATENT DOCUMENTS

| | | | |
|---|---|---|---|
| 2008/0106519 A1* | 5/2008 | Murray | G06F 1/1626 |
| | | | 345/169 |
| 2010/0078343 A1 | 4/2010 | Hoellwarth et al. | |
| 2010/0148995 A1* | 6/2010 | Elias | G06F 3/0202 |
| | | | 341/22 |
| 2011/0241999 A1 | 10/2011 | Thier | |
| 2013/0063286 A1* | 3/2013 | Elias | G06F 3/044 |
| | | | 341/33 |
| 2014/0069791 A1* | 3/2014 | Chu | H01H 13/704 |
| | | | 200/5 A |
| 2014/0147310 A1* | 5/2014 | Hunt | F04B 39/06 |
| | | | 417/423.3 |
| 2014/0262715 A1* | 9/2014 | Lee | B41M 5/267 |
| | | | 200/5 A |
| 2015/0091867 A1* | 4/2015 | Bokma | G06F 3/03547 |
| | | | 345/174 |
| 2016/0048235 A1* | 2/2016 | Poupyrev | G06F 3/044 |
| | | | 345/174 |
| 2016/0048236 A1* | 2/2016 | Poupyrev | G06F 3/044 |
| | | | 345/174 |
| 2016/0335913 A1* | 11/2016 | Grant | G01S 19/49 |

* cited by examiner

US 10,732,728 B1

KEYBOARD WITH TOUCH SENSOR

This application claims the benefit of provisional patent application No. 62/331,892, filed May 4, 2016, which is hereby incorporated by reference herein in its entirety.

FIELD

This relates generally to electronic devices such as keyboards and, more particularly, to devices such as keyboards with touch sensor functionality.

BACKGROUND

Keyboards may be incorporated into laptop computers and may be used as accessories for electronic devices such as tablet computers and other devices.

Some keyboards have trackpads to allow a user to supply touch input. Due to space considerations and other constraints, it can be difficult or impossible to provide desired touch sensor functionality to components such as keyboards.

SUMMARY

A keyboard may have keys that are overlapped by a touch sensor. The keys may be pressed by a user and the touch sensor may be used to supply touch input.

Key sensor circuitry in the keyboard may be coupled to switches in the keys using traces on a printed circuit or other substrate. The switches may be mounted to the substrate under movable key members. During operation, the key sensor circuitry may monitor the switches to determine when the keys are being pressed by the user.

The keyboard may also have touch sensor circuitry. The touch sensor circuitry may be capacitive touch sensor circuitry that monitors capacitive electrodes in the touch sensor for touch input from the user. The touch sensor may be a fabric touch sensor that is formed from a layer of fabric. The fabric may be woven fabric or other fabric in which conductive strands of material serve as the electrodes. The conductive strands may be copper wires coated with polymer or other conductive strands of material.

DETAILED DESCRIPTION

Figure 1:
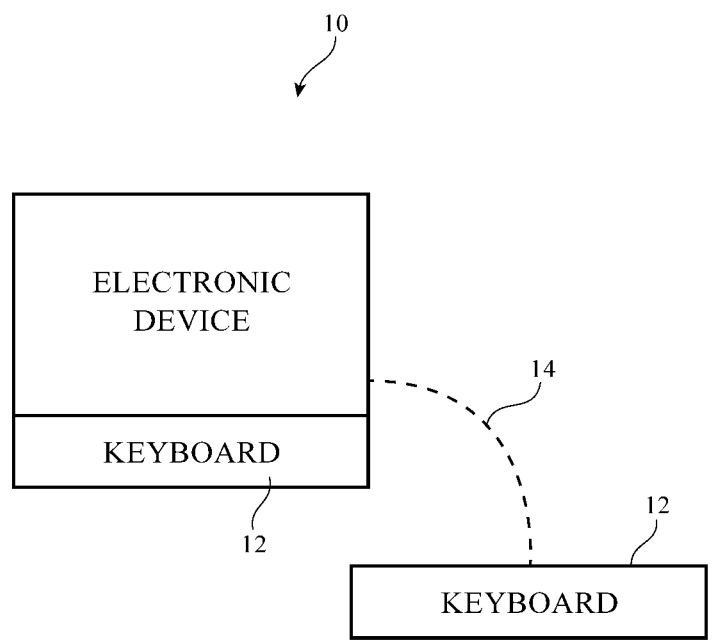
FIG. 1 is a schematic diagram of an illustrative electronic device and associated keyboards in accordance with an embodiment.

A keyboard may be provided with keys to receive keypress input from a user and may be provided with overlapping touch sensor circuitry to receive touch input from a user. An illustrative system of the type that may include keyboards is shown in FIG. 1. The system of FIG. 1 may include an electronic device such as electronic device 10. Device 10 may be an electronic device such as a laptop computer, a computer monitor containing an embedded computer, a tablet computer, a cellular telephone, a media player, or other handheld or portable electronic device, a smaller device such as a wristwatch device, a pendant device, a headphone or earpiece device, a device embedded in eyeglasses or other equipment worn on a user's head, or other wearable or miniature device, a television, a computer display that does not contain an embedded computer, a gaming device, a navigation device, an embedded system such as a system in which electronic device 10 is mounted in a kiosk, in an automobile, airplane, or other vehicle, other electronic equipment, or equipment that implements the functionality of two or more of these devices. If desired, electronic device 10 may be a removable external case for electronic equipment or other device accessory, may be a strap, may be a wrist band or head band, may be a removable cover for a device, may be a case or bag that has straps or that has other structures to receive and carry electronic equipment and other items, may be a necklace or arm band, may be a wallet, sleeve, pocket, or other structure into which electronic equipment or other items may be inserted, may be part of a chair, sofa, or other seating (e.g., cushions or other seating structures), may be part of an item of clothing or other wearable item (e.g., a hat, belt, wrist band, headband, shirt, pants, shoes, etc.), or may be any other suitable device that includes circuitry.

Keyboards 12 may be used to gather input from a user. As shown in FIG. 1, keyboards 12 may be incorporated into electronic devices such as device 10 or may be coupled to electronic devices such as device 10 via a path such as path 14. Path 14 may be a wired or wireless path. Configurations in which device 10 includes an embedded keyboard 12 and is also coupled to a stand-alone external keyboard 12 by path 14 may be used, if desired.

Figure 2:
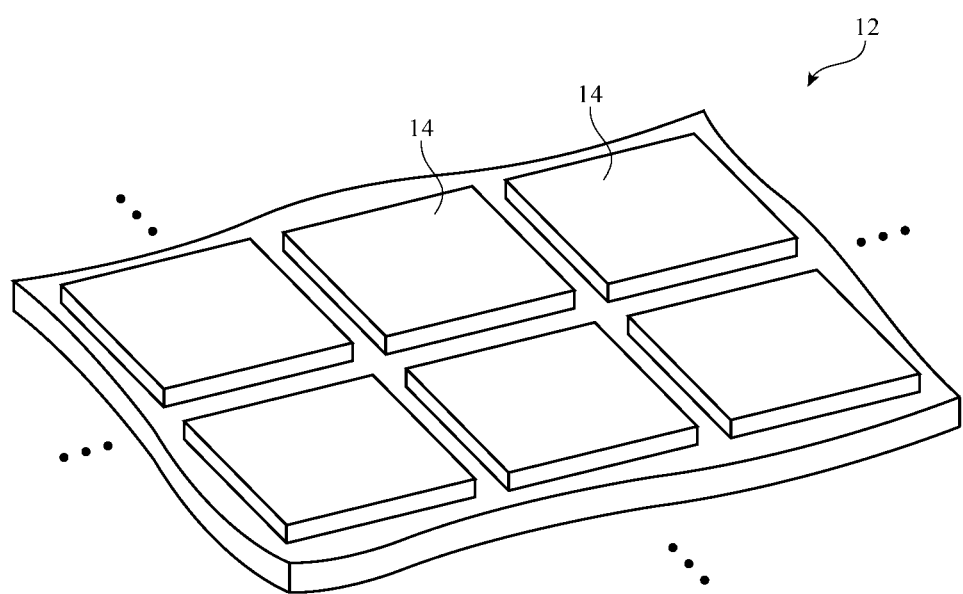
FIG. 2 is a perspective view of a portion of a keyboard in accordance with an embodiment.

FIG. 2 is a perspective view of a portion of keyboard 12. As shown in FIG. 2, keyboard 12 may have an array of keys 14. Keys 14 may be pressed by a user to supply keyboard 12 with keypress input (keypress events). Keys 14 may be alphanumeric keys, may be keys labeled with text (e.g., "backspace," "shift," etc.), may serve as function keys, may include special-function keys (e.g., keys to alter the magnification of on-screen content, keys for placing a device in a sleep mode, etc.), may be single-function or multi-function buttons, may be alphanumeric keys arranged in a QWERTY format, may be arranged in rows and columns or other patterns, may be configured to form other types of keyboard devices (e.g., numeric keypads, etc.), or may be any other suitable keys.

Figure 3:
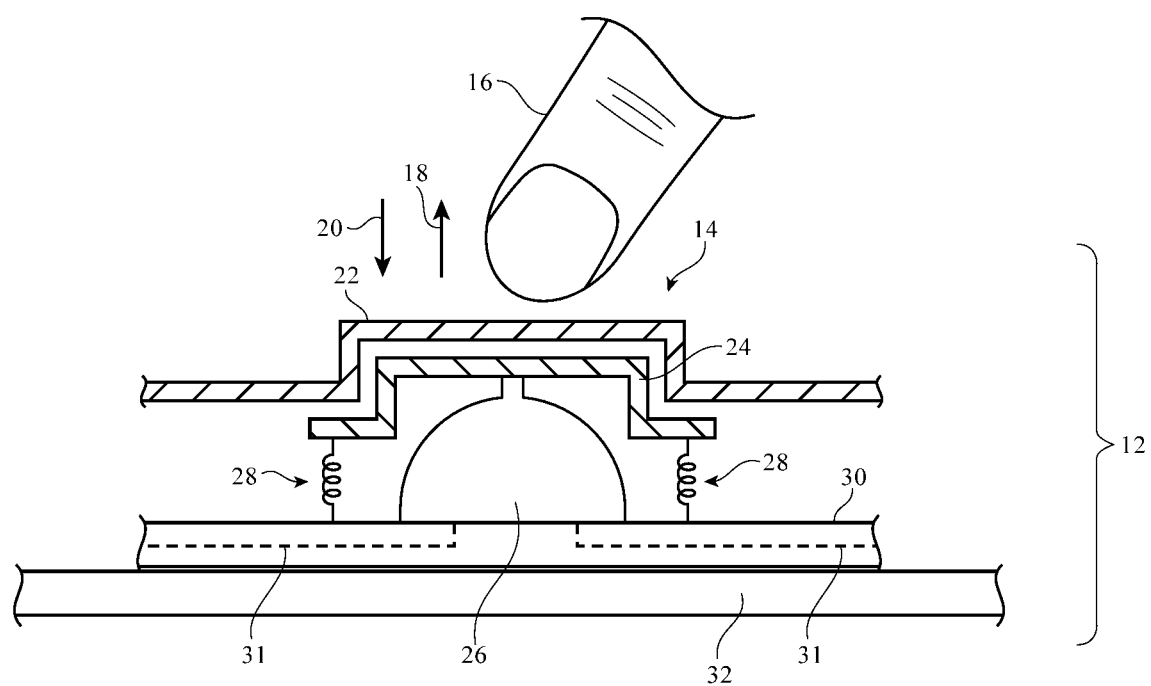
FIG. 3 is a cross-sectional side view of an illustrative key in a keyboard in accordance with an embodiment.

A cross-sectional side view of an illustrative key in keyboard 12 is shown in FIG. 3. As shown in FIG. 3, a user's finger (finger 16) or other external object may be used to press down (inwardly) on key 14 in direction 20. Key 14 may have a movable key member such as movable key member 24 (sometimes referred to as a key cap). When pressed in direction 20, key member 24 may move in direction 20 and may press against and close switch 26 (e.g., a dome switch or other suitable switch with open and closed states). In response to closing switch 26, keyboard control circuitry in keyboard 12 may detect a keypress event and may supply the keypress information to control circuitry in device 10. The keypress event may then be used as a control input for keyboard 12 and/or device 10.

Figure 4:
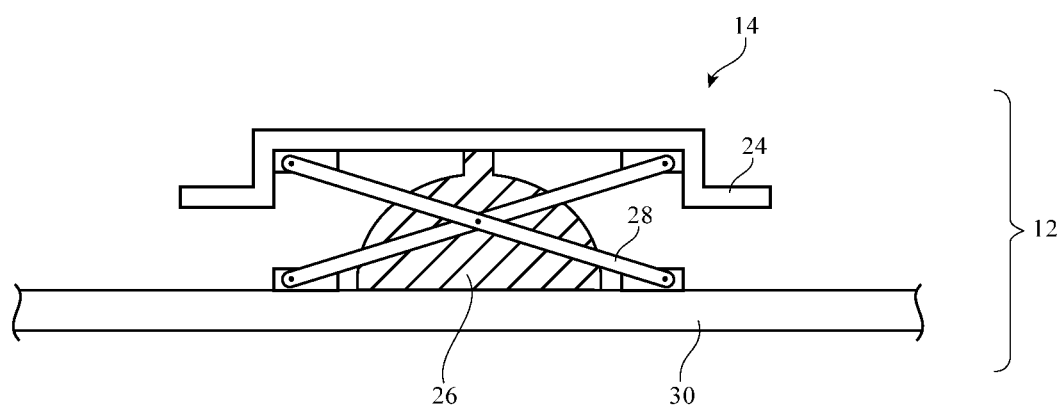
FIG. 4 is a cross-sectional side view of an illustrative keyboard key that has a scissor mechanism in accordance with an embodiment.

Springs or other biasing structures such as biasing structures 28 may be used to restore key 14 to its original undepressed state after pressure from finger 16 is released (i.e., biasing structures 28 may push key member 24 upwards in direction 18 when a user lifts finger 16 off of key 14). Biasing structures 28 may be formed from springy structures such as foam, elastomeric polymer, spring metal, etc. In the example of FIG. 4, biasing structures 28 have been implemented using a scissor-shaped structure with springs that supports and biases key member 24 upwards. Other types of structures for supporting and biasing key members 24 for keys 14 may be used, if desired.

As shown in FIG. 3, keyboard 12 may have a housing such as housing 32. Housing 32 may be formed from one or more layers of material such as plastic, metal, fabric, and other materials. Keyboard substrate 30 may be mounted within housing 32. Biasing structures 28 may be coupled between movable key members such as key member 24 and substrate 30 and/or may be coupled between key member 24 and housing 32 or other structures in keyboard 12.

Keyboard substrate 30 may include signal traces 31 that allow control circuitry to communicate with keys 14 (e.g., traces that allow circuitry to monitor switches 26). Substrate 30 may be, for example, a printed circuit (e.g., a flexible printed circuit formed from a sheet of polymer with metal traces or a rigid printed circuit formed form a rigid printed circuit board material such as fiberglass-filled epoxy). Switches 26 may be mounted to substrate 30 (e.g., with solder, conductive adhesive, welds, etc.). Traces 31 on substrate 30 may be coupled between the switch 26 of each key 14 and associated key sensor circuitry so that the circuitry may detect keypress events (i.e., so that the circuitry can determine which keys 14 have been depressed by monitoring which switches 26 have been closed).

Key members 24 may be covered with one or more layers of plastic, metal, fabric, or other materials (see, e.g., illustrative layer 22). To help ensure that the shape of layer 22 conforms to the raised key shapes of keys 14, layer 22 may be debossed (embossed) in a die (e.g., a heated die with key-shaped impressions that compresses layer 22 between opposing upper and lower structure into the shapes of keys 14). Laser processing techniques and/or other techniques may be used to form perforations and/or other openings in layer 22, may be used to selectively cut fibers, and/or may otherwise be used to process portions of the material of layer 22 (e.g., to adjust key stiffness, keyboard appearance, and/or other attributes of keyboard 12).

In addition to pressing on desired keys 14 to supply keypress input, a user of keyboard 12 may desire to supply keyboard 12 with touch input. Keyboard 12 may, if desired, be provided with a trackpad (e.g., a capacitive touch sensor with a rectangular outline or other suitable shape that is used to gather touch input from a user). A trackpad may, as an example, be located below rows of keys in the middle of keyboard 12.

Keyboard 12 may also be provided with a touch sensor that overlaps one or more of keys 14. This touch sensor may be formed from capacitive touch sensor electrodes or other touch sensor structures. With one illustrative configuration, which may sometimes be described herein as an example, keyboard 12 may incorporate a touch sensor that is formed from conductive strands of material in a layer of fabric (see, e.g., layer 22 of FIG. 3). The conductive strands in a fabric touch sensor may include horizontal strands of material that overlap with perpendicular vertical strands of material to form a grid of touch sensor electrodes that intersect at an array of intersection locations. A fabric touch sensor of this type may, as an example, overlap most or all of keys 14 and thereby may serve as a keyboard-sized integral touch surface with which a user may supply touch input (multitouch gestures, single-finger pointer-control input for an on-screen cursor, swipes, taps, and other touch commands). To conserve space in this type of keyboard, it may be desirable to omit any separate trackpads (i.e., keyboard 12 may be formed from an array of keys and a touch sensor that extends over some or all of the keys and need not have any separate trackpad structures). Configurations of this type may sometimes be described herein as an example. In general, keyboard 12 may include any suitable input-output devices (e.g., buttons, capacitive touch sensors or other touch sensors, etc.).

Figure 5:
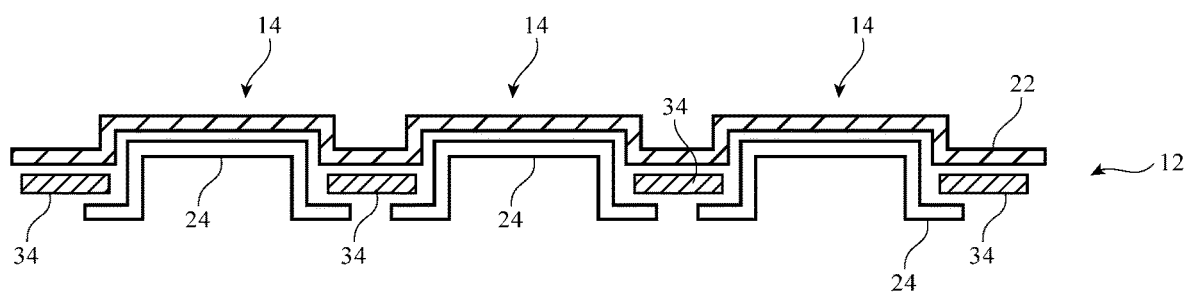
FIG. 5 is a cross-sectional side view of an illustrative keyboard that has a key support structure with an array of openings that receive movable key members in accordance with an embodiment.

Keyboard 12 may include a key member support structure such as key member support structure 34 of FIG. 5. Support structure 34, which may sometimes be referred to as a key support layer, key support structure, or key web, may have an array of openings. The array of openings may be patterned to accommodate a desired key layout for keyboard 12. Each opening in support structure 34 may receive a respective movable key member 24 for a respective key 14. Key support structure 34 may help maintain key members 24 in desired positions within keyboard 12. Key support structure 34 may be formed from a layer of plastic or other suitable materials. If desired, key support structure 34 may be omitted from keyboard 12 (e.g., in configurations in which key members 24 are secured to substrate 30 using biasing structures and/or other attachment mechanisms, configurations in which key members 24 are maintained in desired positions using layer 22, etc.).

Figure 6:
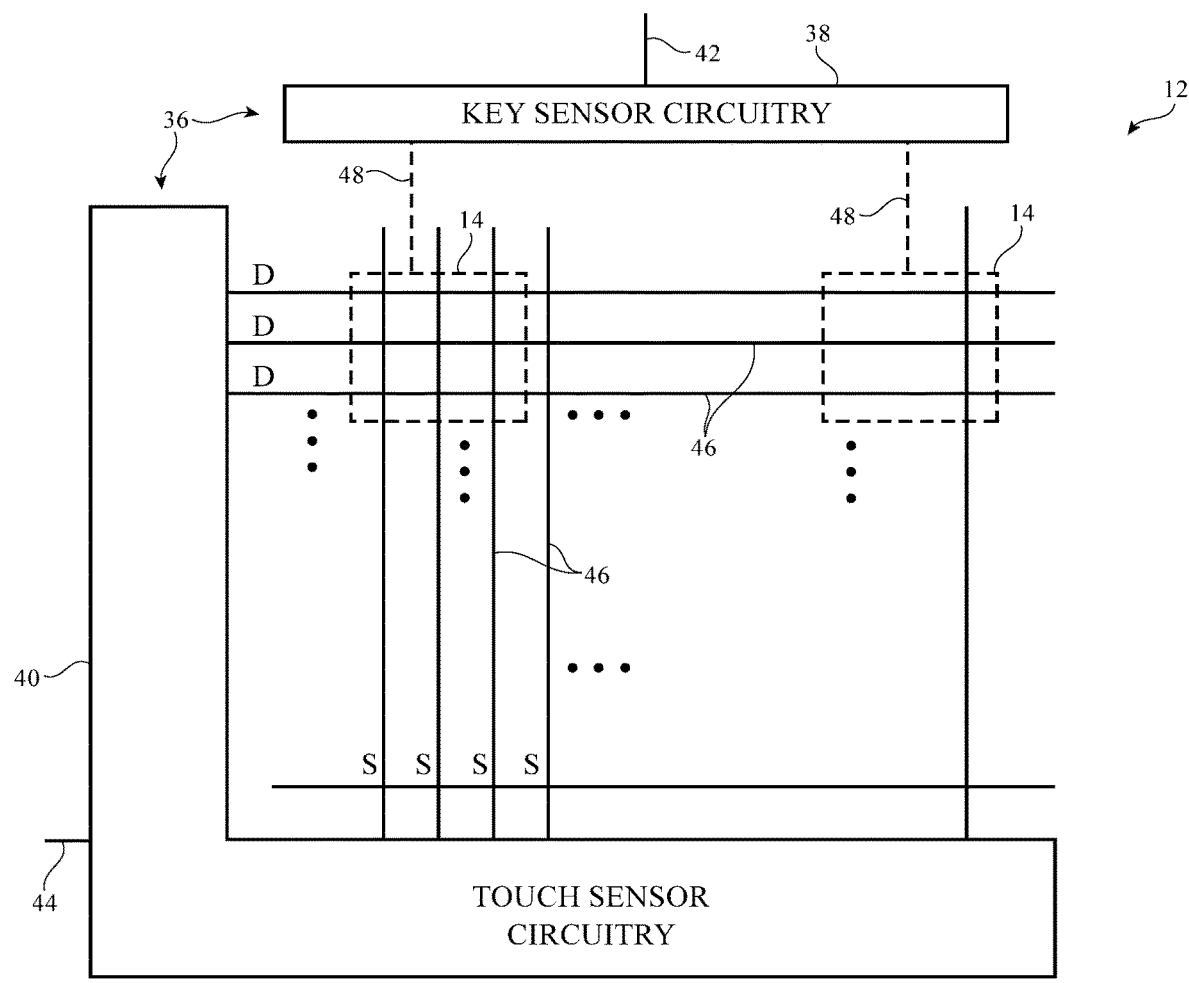
FIG. 6 is a circuit diagram of an illustrative keyboard with keys and an overlapping grid of touch sensor electrodes in a capacitive touch sensor in accordance with an embodiment.

FIG. 6 is a circuit diagram of an illustrative keyboard. As shown in FIG. 6, keyboard 12 may include control circuitry 36 such as touch sensor circuitry 40 and key sensor circuitry 38. Keyboard 12 may have an array of switches 26 (FIG. 3) associated with a corresponding array of keys 14.

Signal paths such as paths 48 (e.g., traces 31 on substrate 30) may be used to couple key sensor circuitry 38 to the switches 26 of keys 14. Whenever a user presses on a given one of keys 14, the switch 26 in that key will change stage (e.g., from open to closed). Sensor circuitry 38 monitors the status of all of switches 26 in keyboard 12 and, in response to detection of a change of switch state, generates corresponding output signals on path 42 (e.g., signals that inform control circuitry in device 10 or other equipment of each detected key press event).

Conductive lines 46 may serve as capacitive electrodes in a capacitive touch sensor (touch sensor grid) that overlaps keys 14. Any suitable number of horizontal and vertical lines 46 may overlap each key 14. For example, there may be 1-5, more than 2, more than 3, 2-4, fewer than 10, fewer than 5, or other suitable number of horizontal lines 46 overlapping each key 14 and there may be 1-5, more than 2, more than 3, 2-4, fewer than 10, fewer than 5, or other suitable number of vertical lines 46 overlapping each key 14. Conductive lines 46 may be formed from patterned thin-film metal traces in layer 22 (e.g., in scenarios in which layer 22 is formed from a layer of plastic), may be formed from conductive strands of material (e.g., in scenarios in which layer 22 is formed from a layer of fabric), and/or may be formed from other conductive structures that form capacitive touch sensor electrodes. Configurations in which lines (electrodes) 46 are formed from conductive strands of material may sometimes be described herein as an example.

As shown in FIG. 6, touch sensor circuitry 40 may be coupled to a horizontal set of lines 46 and a perpendicular set of vertical lines 46. Touch sensor circuitry 40 may provide drive signals D to one of these sets of lines 46 (i.e., horizontal lines 46 in the example of FIG. 6) and may gather corresponding sense signals S on the other of these sets of lines 46 (i.e., vertical lines 46 in the example of FIG. 6). Capacitive coupling between the drive and sense lines varies in the presence of a user's finger over a drive-line-to-sense-line intersection. As a result, touch sensor circuitry 40 can process the drive and sense signals to determine which of the intersections of the horizontal and vertical lines 46 are being overlapped by a user's finger(s) or other external objects. When touch input is detected in this way, touch sensor circuitry 40 may provide a processor or other control circuitry in device 10 or other equipment with information on the touch input using a path such as path 44.

In a typical scenario, a user may enter text or other key press input into keyboard 12 by typing on keys 14. Key sensor circuitry 38 may convey information on the text or other input that the user is typing into keyboard 12 over path 42. When the user desires to reposition an on-screen cursor, to make a multitouch gesture (e.g., a pinch-to-zoom gesture, a two-finger swipe, a three-finger swipe, a two-finger or three-finger tap, etc.), to make a one-finger swipe or other gesture, or to supply keyboard 12 with other touch input, the user may move one or more of the user's fingers across the surface of keys 14. During touch input events such as these, touch sensor circuitry 40 may monitor capacitance changes at the intersections of the horizontal and vertical capacitive touch sensor electrodes (paths 46) to gather touch input data and may supply the touch input that is gathered from the capacitive touch sensor electrodes to control circuitry such as control circuitry in device 10 and/or control circuitry in keyboard 12 via path 44.

Touch sensor electrodes 46 may be formed from conductive strands of material in layer 22. Layer 22 may, as an example, include fabric. The fabric may be woven, knitted, or braided and/or may include strands of material that have been intertwined using other techniques (e.g., felt). With one suitable arrangement, which may sometimes be described herein as an example, the fabric of layer 22 may be woven fabric and electrodes 46 may be formed from selected warp and weft strands in the woven fabric.

Figure 7:
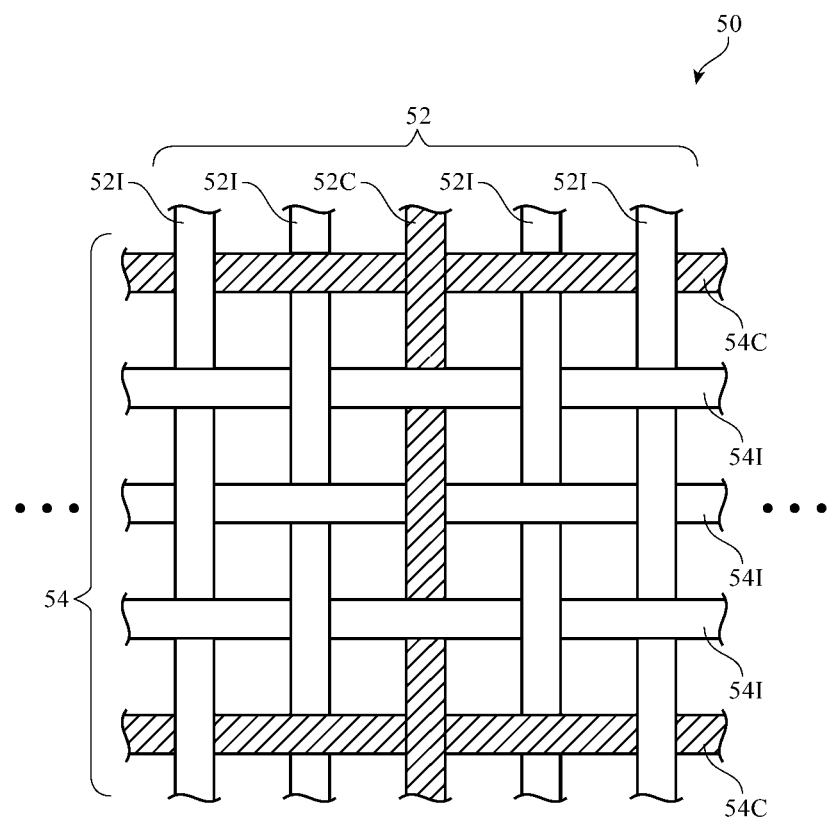
FIG. 7 is a top view of an illustrative fabric for a keyboard in accordance with an embodiment.

FIG. 7 is a top view of an illustrative woven fabric of the type that may be used in layer 22 of keyboard 12. As shown in FIG. 7, fabric 50 may include warp strands 52 and weft strands 54. Warp strands 52 run along a first dimension of fabric 50 (e.g., the vertical dimension in the orientation of FIG. 7) and weft strands 54 run perpendicularly along a second dimension of fabric 50 (e.g., the horizontal dimension in the orientation of FIG. 7). Some of warp strand 52 such as strands 52I may be insulating and some of strands 52 may such as strands 52C may be conductive and may therefore serve as the vertically extending electrodes 46 in the touch sensor of FIG. 6. Some of weft strands 54 such as weft strands 54I may be insulating and some of strands 54 may be conductive such as strands 54C and may therefore serve as horizontally extending electrodes 46 in the touch sensor of FIG. 6. Woven fabric 50 of FIG. 7 has a plain weave, but in general, fabric 50 may have any suitable construction (e.g., fabric 50 may have a basket weave or any other suitable fabric construction). Plain weave fabric constructions may sometimes be described herein as an example.

The strands of material in fabric 50 such as strands 52 and 54 may each include one or more monofilaments (sometimes referred to as fibers or monofilament fibers). The monofilaments may have one or more layers (e.g., a core layer alone, a core layer with an outer coating, a core layer with an inner coating layer that is covered with an outer coating layer, a core layer coated with three or more additional layers, etc.). Strands of material that are formed from intertwined monofilaments may sometimes be referred to as yarns, threads, multifilament strands or fibers, etc. In general, any suitable types of strands or combination of different types of strands may be used in forming fabric 50 (e.g., monofilaments, yarns formed from multiple monofilaments, etc.). Strands with multiple monofilaments may have 2-200 monofilaments, 2-50 monofilaments, 2-4 monofilaments, 2 monofilaments, 4 monofilaments, fewer than 10 monofilaments, 2-10 monofilaments, fewer than 6 monofilaments, more than 2 monofilaments, or other suitable number of monofilaments.

Insulating strands may be formed from one or more dielectric materials such as polymers, cotton and other natural materials, etc. Conductive strands may be formed from metal or other conductive material and optional dielectric. For example, conductive strands may be formed from solid monofilament wire (e.g., copper wire), wire that is coated with one or more dielectric and/or metal layers (e.g., copper wire that is coated with polymer), a monofilament of polymer coated with metal or other conductive material, a monofilament of polymer coated with metal that is covered with an outer polymer coating, etc. The diameter of the monofilaments may be 5-200 microns, more than 10 microns, 20-30 microns, 30-50 microns, more than 15 microns, less than 200 microns, less than 100 microns, or other suitable diameter. The thickness of each of the coatings in a monofilament may be less than 40% of the diameter of the monofilament, less than 10% of the diameter, less than 4% of the diameter, more than 0.5% of the diameter, 1-5% of the diameter, or other suitable thickness. If desired, conductive monofilaments may be intertwined to form conductive yarn. Conductive yarn may include only conductive monofilaments or may include a combination of conductive monofilaments and insulating monofilaments.

Figure 8:
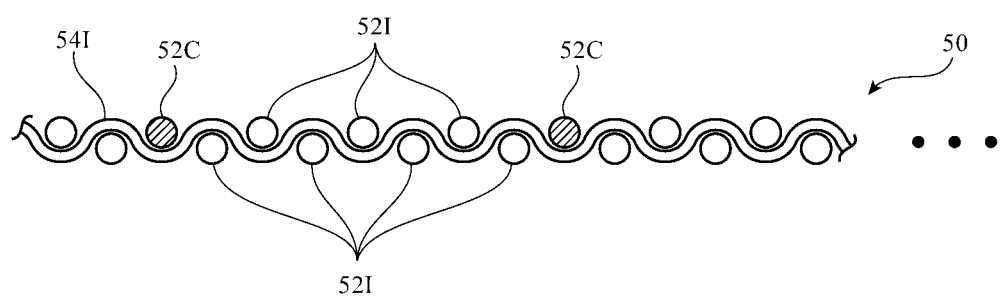
FIGS. 8 and 9 are cross-sectional side views of illustrative layers of fabric in accordance with embodiments.
Figure 9:
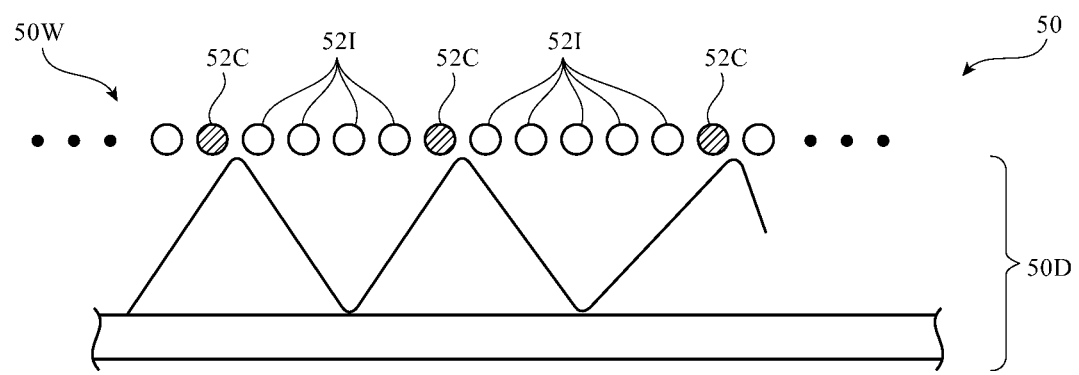

Fabric 50 may have a relatively thin single-layer construction of the type shown in FIG. 8 or may have a three-dimensional construction. If desired, a layer of woven material may be supported by a spacer structure. As shown in FIG. 9, woven layer 50W of fabric 50 may be supported by spacer structures 50D. Structures 50D may be formed from a substrate layer (e.g., a layer of plastic, etc.) and associated compressible structures (e.g., foam, elastomeric material, three-dimensional multilayer fabric, etc.) and/or may be formed by three-dimensional weaving or other fabric construction techniques. If desired, a printed circuit or other substrate may be included in structures 50D. A ground plane or other conductive structures may, if desired, be spaced apart from a grid of electrodes (conductive strands in woven layer 50D). With an arrangement of this type, touch sensor signals may be gathered using drive and sense lines formed from conductive strands of material in fabric layer 50W and force measurements may be made by detecting changes in the capacitance between conductive strands in fabric 50W and ground plane or other conductive structures (e.g., metal traces on a printed circuit) that are spaced apart from layer 50W. These changes in capacitance may arise, for example, when a user's finger compresses spacer 50D and thereby reduces the distance between the conductive strands in layer 50W and underlying conductive structures. Keys 14 may be formed from rectangular sections of the structure shown in FIG. 9 (i.e., pads that serve as keys may be formed from compressible fabric structures) in addition to forming keys 14 or instead of forming keys 14 from movable key members 24.

In keyboard 12, movable key members 24 may bear against dome switches such as dome switch 26 or other suitable switch structures mounted on substrate 30. The cross-sectional side views of illustrative keyboards 12 in FIGS. 10 and 11 have key members 24 with central downward protruding portions that bear against respective switches 26. Biasing structures 28 of FIG. 3, scissor mechanisms such as structure 28 of FIG. 4, or other suitable structures may be used to bias and support key members 24. In the example of FIG. 5, key member 24 has flanged portions that catch under key support structure 34 and help retain key members 24 within the openings of key support structure 34. In configurations of the type shown in FIGS. 10 and 11, key members 24 do not have any flanged portions and may be retained by overlapping layers of fabric, by the biasing structures 28, or other suitable retention mechanisms. The key member arrangements of FIGS. 10 and 11 and the key member arrangements of FIGS. 3, 4, and 5 are presented as examples. In general, keys 14 may have any suitable key members.

Figure 10:
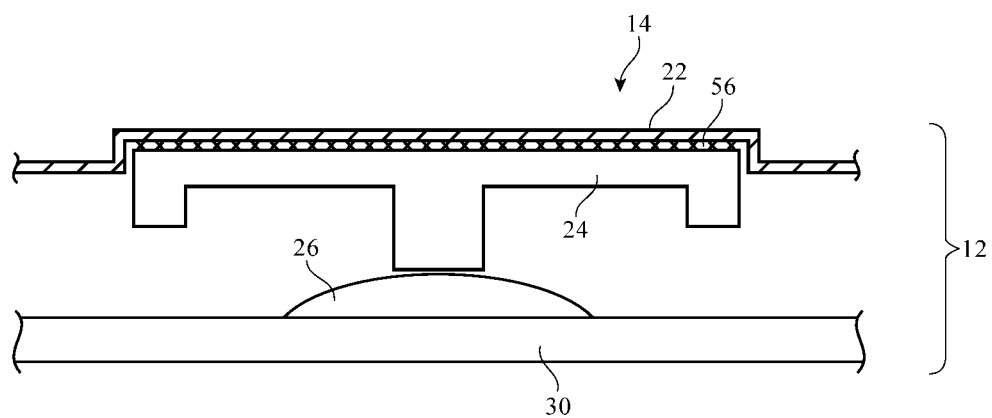
FIGS. 10 and 11 are cross-sectional side views of illustrative keyboard keys in accordance with embodiments.

As shown in FIG. 10, keyboard 12 and key members 24 may be covered with a single layer of material 22 such as a single layer of fabric 50. Adhesive 56 may be used to attach layer 22 to key members 24 and may be used to attach layer 22 to key support structure 34 in keyboard configurations that include a key support structure such as the keyboard configuration of FIG. 5.

Conductive strands in fabric 50 of layer 22 may be made visually indistinct from insulating strands in fabric 50 by matching the size and/or color of the insulating and conductive strands. For example, the diameters of the conductive strands and insulating strands may differ by less than 50%, less than 20%, less than 5%, 1-10%, more than 0.1%, or other suitable amount so that the conductive strands are not visibly distinct from the insulating strands. The conductive strands may also be coated with colored polymer having a color that matches the color of the insulating strands of material in fabric 50 or may otherwise be treated so that the appearance of the conductive strands matches that of the insulating strands. As an example, fabric 50 and/or the conducting and/or insulating strands may be coated with a colored polymer treatment (e.g., a colored ink coating such as a gray, black, or white coating, etc.). If desired, conductive strands may be formed from conductive monofilaments that are surrounded by intertwined insulating monofilaments, thereby hiding the conductive material in the conductive strands from view. The insulating monofilaments in conductive strands with this type of arrangement may have the same appearance (e.g., the same color) as insulating monofilaments in insulating strands of material in fabric 50 (as an example).

Figure 11:
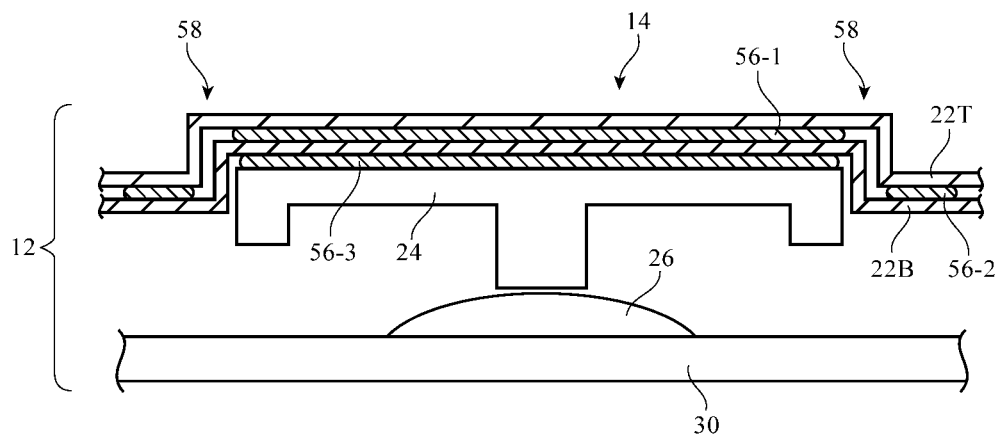

If desired, conductive strands of material and other structures in fabric 50 that are associated with forming the touch sensor may be hidden from view by covering fabric 50 with an additional layer of material. This type of arrangement is shown in FIG. 11. Fabric 50 (e.g., woven fabric with sets of horizontal and vertical conductive strands of material that serve as capacitive touch sensor electrodes as described in connection with FIG. 6) may be used in forming inner layer 22B. Layer 22B may be attached to button member 24 by adhesive layer 56-3. Outer layer 22T may cover inner layer 22B and may therefore hide layer 22B from view. Outer layer 22T may be a layer of plastic, a layer of fabric, and/or one or more layers of other materials. Outer layer 22T may be formed solely from insulating strands or may be formed from strands of other materials that provide keyboard 12 with an attractive external appearance. Adhesive 56-1 and 56-2 may be used in attaching outer layer 22T to inner layer 22B. Adhesive may also be used in attaching fabric in layer 22 of FIG. 10 and/or in layers 22B of FIG. 11 to key support structure 34 (FIG. 5). Gaps may be formed in the adhesive layers along the peripheral edges of key members 24 (see, e.g., gap 58 of FIG. 11, which separates adhesive layer 56-1 on the upper surface of key member 24 and adhesive layer 56-2, which joins layers 22T and 22B in the portions of keyboard 12 that lie between adjacent keys 14). These gaps may help enhance the flexibility of the fabric and other layers of material that overlap key members 24 and thereby helps allow key members 24 to move freely when pressed and released by a user. Perforations in layers 22T and/or 22B may also be provided around the edges of keys 14 to facilitate key movement.

Figure 12:
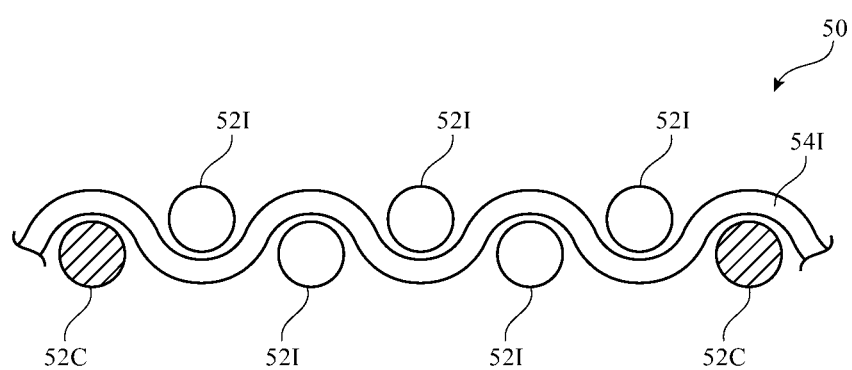
FIG. 12 is a cross-sectional side view of an illustrative fabric showing where conductive strands of material may be located relative to insulating strands of material in accordance with an embodiment.

It may be desirable to form the conductive strands of material in fabric 50 that serve as the capacitive touch sensor electrodes for the touch sensor in the outermost layer (or nearly outermost layer) of keyboard 12 as shown in FIG. 10 to enhance touch sensor functionality (i.e., to make accurate capacitance measurements by omitting unnecessary materials between the touch sensor electrodes and the fingers of a user). In configurations in which fabric 50 is formed as the outermost keyboard layer, conductive strands in fabric 50 may be formed on the underside of fabric 50 as shown in FIG. 12 (see, e.g., illustrative conductive warp strands 52C that are hidden under overlapping weft strands 54I). The construction of fabric 50 in this type of arrangement may allow warp strands 52C to be mostly located under weft strands 54I and rarely above weft strands 54I. The same arrangement may also be used to hide conductive weft strands under insulating warp strands. If desired, touch sensor electrodes formed from conductive strands can also be hidden from view by applying polymer coatings or other coatings to the strands of fabric 50, by using conductive strands in fabric 50 in which conductive fibers are surrounded by insulating fibers, and otherwise matching the appearance of the conductive strands to the insulating strands.

The foregoing is merely illustrative and various modifications can be made by those skilled in the art without departing from the scope and spirit of the described embodiments. The foregoing embodiments may be implemented individually or in any combination.

What is claimed is:

1. A keyboard having an interior and an exterior, the keyboard comprising:
   a substrate;
   an array of switches mounted on the substrate;
   an array of movable key members each of which overlaps a respective one of the switches to form a corresponding key; and
   a fabric touch sensor that overlaps the movable key members, wherein the fabric touch sensor comprises conductive strands that form drive lines and sense lines, wherein the movable key members are interposed between the array of switches and the fabric touch sensor, wherein the fabric touch sensor is exposed to the exterior, wherein the fabric touch sensor is separated from the substrate by a first distance in a first region that overlaps a movable key member, wherein the fabric touch sensor is separated from the substrate by a second distance in a second region between adjacent movable key members, and wherein the first distance and the second distance are different.

2. The keyboard defined in claim 1 further comprising: control circuitry that is coupled to the switches and that is configured to monitor for key presses that close the switches.

3. The keyboard defined in claim 2 wherein the control circuitry is coupled to the conductive strands in the fabric touch sensor and that is configured to gather touch input from the conductive strands.

4. The keyboard defined in claim 3 wherein the conductive strands include a first set of conductive strands that run across the keys along a first dimension and a second set of conductive strands that run across the keys along a second dimension that is perpendicular to the first dimension.

5. The keyboard defined in claim 4 wherein each of the conductive strands include at least one wire coated with polymer.

6. The keyboard defined in claim 5 wherein the wire comprises copper wire.

7. The keyboard defined in claim 6 wherein the keys comprise alphanumeric keys that have a QWERTY layout.

8. The keyboard defined in claim 3 wherein the fabric comprises woven fabric, wherein the conductive strands comprise conductive warp strand and conductive weft strands, and wherein the fabric comprises insulating warp strands and insulating weft strands.

9. The keyboard defined in claim 3 wherein the switches comprise dome switches.

10. The keyboard defined in claim 9 further comprising metal traces on the substrate that couple the switches to the control circuitry.

11. The keyboard defined in claim 3 wherein the fabric touch sensor comprises woven fabric that includes the conductive strands.

12. The keyboard defined in claim 11 further comprising a layer of adhesive that attaches the woven fabric to the movable key members.

13. The keyboard defined in claim 3 wherein the control circuitry includes capacitive touch sensor circuitry that gathers the touch input from the conductive strands.

14. The keyboard defined in claim 13 wherein each of the conductive strands comprises at least one copper wire with a polymer coating.

15. The keyboard defined in claim 1 wherein the switches each have a height that is less than the first distance and less than the second distance.

16. Apparatus, comprising:
at least one key having a movable key member that is configured to close a switch in response to pressure applied to the movable key member;
an inner fabric layer comprising a grid of conductive lines that form a capacitive touch sensor that overlaps the key, wherein the inner fabric layer conforms to a raised surface of the movable key member; and
an outer fabric layer that overlaps the grid of conductive lines and that is coupled to the inner fabric layer with an adhesive, wherein the adhesive overlaps the movable key member.

17. The apparatus defined in claim 16 wherein the inner fabric layer comprises woven fabric that includes insulating strands and conductive strands, wherein the grid of conductive lines comprises drive lines and sense lines that detect multitouch gesture input, and wherein the conductive strands form the drive lines and the sense lines in the grid of conductive lines.

18. The apparatus defined in claim 17 wherein the conductive strands comprise copper wires with polymer coatings.

19. A device, comprising:
a plurality of keys, wherein each of the keys has a movable key cap with a raised surface and an associated switch that is closed when pressed by the movable key cap in response to pressure on the movable key cap;
key sensor circuitry that monitors the keys for key press events;
a fabric layer that overlaps and conforms to the raised surfaces of the movable key caps of the plurality of keys, wherein the fabric layer has insulating strands of material and has conductive warp and weft strands that are intertwined with the insulating strands and wherein each of the movable key caps is between the switch associated with that movable key cap and the fabric layer;
a force sensor formed in addition to the plurality of keys, wherein the force sensor detects a force based on a change in capacitance between the conductive warp and weft strands and a conductive structure overlapped by the fabric layer; and
capacitive touch sensor circuitry that is coupled to the conductive warp and weft strands and that gathers multitouch gesture input from the conductive warp and weft strands.

20. The device defined in claim 19 wherein the movable key caps comprise plastic movable key caps.

* * * * *